US006295232B2

(12) United States Patent
Pille et al.

(10) Patent No.: US 6,295,232 B2
(45) Date of Patent: Sep. 25, 2001

(54) DUAL-TO-SINGLE-RAIL CONVERTER FOR THE READ OUT OF STATIC STORAGE ARRAYS

(75) Inventors: Juergen Pille, Stuttgart; Klaus Helwig, Weil im Schoenbuch; Dieter Wendel, Schoenaich, all of (DE)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/733,328

(22) Filed: Dec. 8, 2000

(30) Foreign Application Priority Data

Dec. 8, 1999 (EP) .......................... 99124515

(51) Int. Cl.[7] .......................... G11C 7/00

(52) U.S. Cl. .......................... 365/189.01; 365/156; 365/205

(58) Field of Search .......................... 365/156, 205, 365/189.05, 189.01

(56) References Cited

U.S. PATENT DOCUMENTS 5,715,210 * 2/1998 Yoo et al. .......................... 365/189.01
5,986,923 * 11/1999 Zhang et al. .......................... 365/156

* cited by examiner

*Primary Examiner*—Huan Hoang

(57) ABSTRACT

A read circuit for semiconductor storage cells (10, 50) including dual read bitlines (23, 24, 51, 52) driven by the cell to full 'zero' signals and 'weak one' signals comprises a read head circuit (53) which includes an inverter (56) in one of the bitlines (52). The inverter serves to turn a 'weak one' signal to a full 'zero' signal. A bit select circuit is integrated into the read head circuit (53) and connects the output of the inverter and the other one of the bitlines (51) through bit select switches (57, 58) to the single line output (XT1) of the read head circuit (53).

12 Claims, 6 Drawing Sheets

Prior Art

DUAL-TO-SINGLE-RAIL CONVERTER FOR THE READ OUT OF STATIC STORAGE ARRAYS

FIELD OF THE INVENTION

The invention relates to a read circuit for storage cells of a semiconductor storage array including dual-to-single-rail conversion. The invention also relates to a method for converting dual bitline read signals to single bitline read signals.

BACKGROUND OF THE INVENTION

Static VSLI semiconductor storage arrays use a single or dual bitline read scheme. Single bitline circuits allow a high density on the cost of noise immunity and performance. This applies in particular to large storage arrays. Dual bitline circuits which use true and complement bitlines for reading out the storage cells are faster and show a higher noise immunity but need more area on the semiconductor chip. Such circuits include a special read head for sensing the voltage difference on the bitlines and convert it to a single data out signal (U.S. Pat. No. 5,949,723).

Known dual bitline read circuits include a bit select circuit, a read head circuit and additional circuits which are required to compensate signal level differences and to achieve full logical signal levels for one and zero bits to produce a reliable data read out. The bit select circuit selects one of a plurality of bitline pairs of those storage cells which are activated by the same word line for a read operation. The storage cells drive the bitlines to full "zero" signals and weak "one" signals respectively where a weak "one" signal is represented by the supply voltage level VDD reduced by the thereshold voltage of the NFET pass device. A bitline swing control circuitry and additional circuitry in the read head circuit is used to compensate this asymmetry.

The bitline swing control circuitry force the bitlines to an intermediate voltage level to reduce the swing of the bitline signals the storage cell has to drive and thereby speeds up the read cycle. The function of the read head circuit is to sense the voltage level difference between the bitlines and to combine the dual read bitlines to a single bitline which is connected to the data out driver. The read head provides an indirect coupling of the bitlines by two cross-coupled PFET devices. This circuitry serves to develop full 'one' and 'zero' signals for being fed to the data out driver. However, the operation of the cross-coupled PFET devices burdens the speed at which the bit signals are developed. The operation of a known dual bitline read circuit of this type is explained below in more detail with reference to FIG. 1.

SUMMARY OF THE INVENTION

It is an object of the invention to improve the performance of dual bitline read circuits without decreasing the reliability of the data read out.

It is a further object of the invention to shift the signal levels on the bitlines to a symmetrical ratio and to improve "weak one" read out signals. It is also an object of the invention to avoids a standby current within the read circuit. According to the invention, as defined in the claims, a read circuit of the type described above and shown in FIG. 1 is improved by avoiding an indirect coupling of the bitlines by cross-coupled PFET devices, and provides instead a direct coupling of the bitlines to reduce the period of generating the bit signals as input of the data out driver.

The read head circuit of the invention comprises an inverter in a first one of the bitlines which turns a 'weak one' signal to a full 'zero' signal. The bit select circuit is integrated into the read head by connecting a second bitline through a first bit select switch to the output of the read head circuit and by connecting the output of the inverter through a second bit select switch to the output of the read head circuit.

According to further aspects of the invention the first bit select switch is a NFET device and the second bit select switch is a PFET device. The first bitline may be assigned to the complement output of the cell and the second first bitline may be assigned to the true output of the cell.

According to a further aspect of the invention said inverter may be part of a feedback loop from the output of the inverter to its input including a PFET switch which is controlled by the output of the inverter and additionally improves the 'one' input level of the inverter and serves to eliminate any DC current in the inverter.

Furthermore, according to another aspect of the invention the input of the inverter is connected to a first one of the bitlines to turn a 'weak one signal to a full zero signal, and its output is directly combined with the second bitline. Such implementation may be used for storage cell arrays the bit columns of which are not divided into sub-columns and therefore do not need a bit select circuitry.

The invention also provides a method for converting dual bitline read signals to single bitline read signals by inverting the read signals on a first one of the bitlines for turning a 'weak one' read signal into a full 'zero' signal and by directly combining the output signals of the inverted read signal with the read signals of the second one of the bitlines.

BRIEF DESCRIPTION OF THE DRAWINGS

In the following an implementation of the invention is described with reference to drawings which show.

DETAILED DESCRIPTION OF A PREFERRED EMBODIMENT OF THE INVENTION

Figure 1:
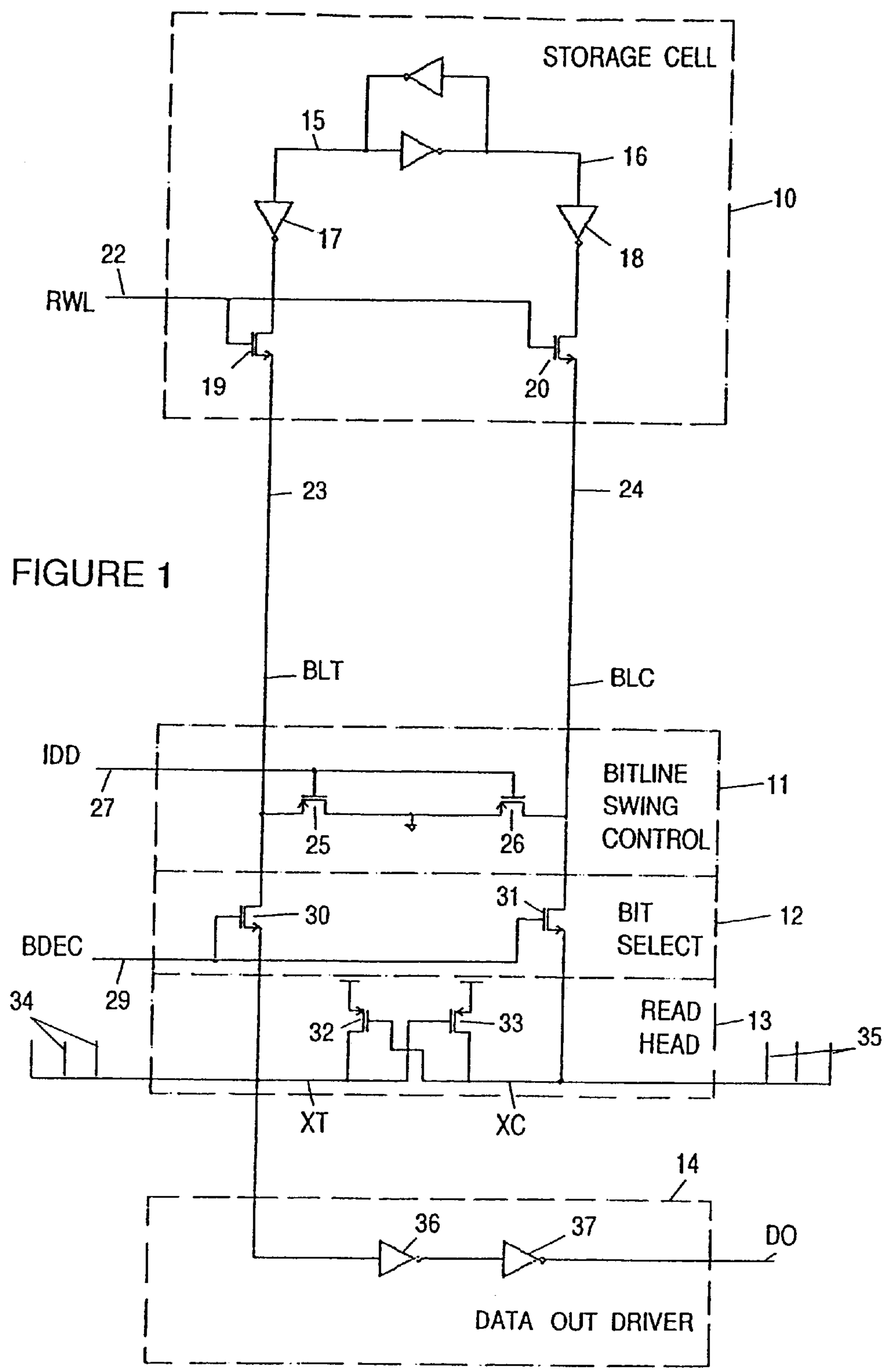
FIG. 1 a circuit diagram of a dual bitline read circuit of the prior art.

FIG. 1 shows a cross-section of a prior art storage array including a single storage cell 10, a bitline swing control 11, bit select circuit 12, a read head 13 and a data out driver 14. The cell 10 is of a well known design and includes true and complement bit output lines 15, 16 which are are connected through amplifier inverters 17, 18 to NFET pass devices 19, 20. The read cycle starts with rising a read wordline 22 which controls the NFET pass devices 19, 20 in parallel to connect the cell 10 to bitlines 23, 24 carrying bitline signals BLT and BLC. Signal BLT represents the true bit stored in the cell 10 and signal BLC represents the complement of the bit stored in the cell 10. For the devices 19, 20 NFET transistors are chosen for the devices 19, 20 to reduce the required chip area. The devices 19, 20 produce on the bitlines 23 and 24 'full zero' signals but only 'weak one' signals. To reduce the swing of these bitline signals, the storage cell 10 is controlled by the bitline swing control circuit 11 comprising PFET devices 25, 26 which force the bitlines 23 and 24 to an intermediate voltage level by means of their threshold levels. One of the PFET devices 25, 26 always draws a DC standby current. For this reason it is required that both PFET devices 25, 26 are switched off for test purposes by an IDD-signal on line 27 to suppress this DC standby current.

The bit select circuit 12 selects the bitline pair 23, 24 out of a plurality of bitline pairs which are not shown in FIG. 1 by a signal BDEC on line 29 and NFET devices 30 and 31 each arranged to switch through one of the bitline signals BLT, BLC to the read head 13. The signal BDEC is generated by a bit decode circuitry not shown. Read head 13 comprises cross coupled PFET devices 32 and 33 to generate a full VDD level of the "one" cell read out signals. The output of device 32 controls device 33 and the output of device 33 controls device 32. As indicated by lines 34 and 35 the read head 13 is common to a plurality of select circuits each of which corresponds to bit select circuit. 12 and is assigned to a column of storage cells. The data out driver 14 includes inverters 36, 37 which receive the output of PFET device 32 and produce the data read out signal DO.

Figure 2:
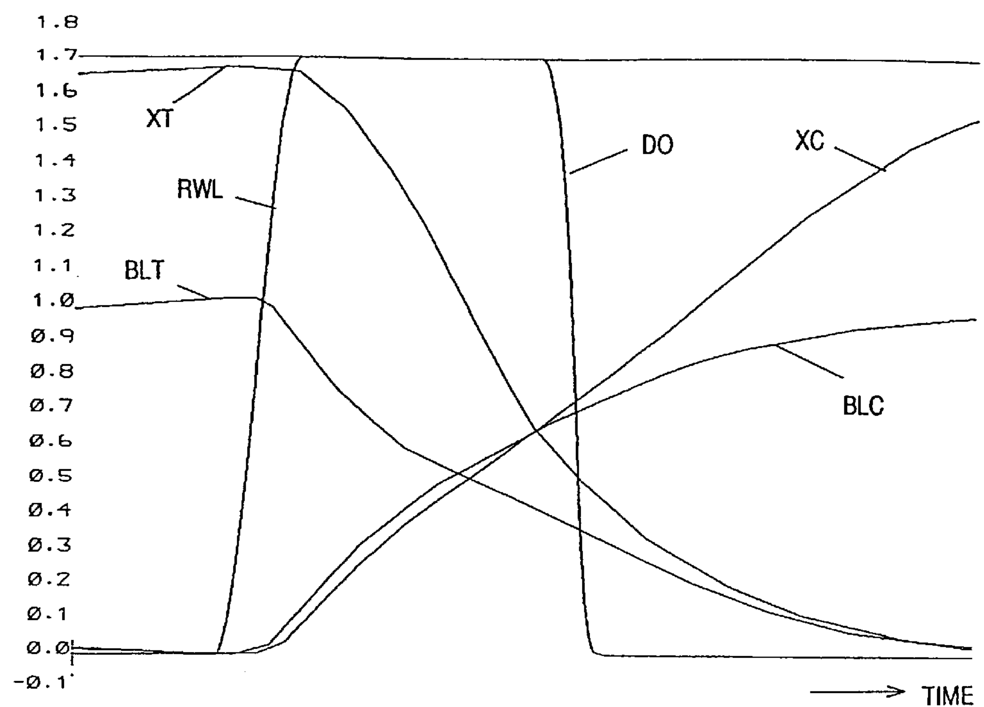
FIGS. 2 and 3 pulse diagrams related to the operation of circuit shown in FIG. 1.

If a "0" is read out of the storage cell 10, line BLT has to be pulled down to zero and bitline signal BLC is raised to a 'weak one' by the cell 10. The bitline signals BLT and BLC are connected to lines XT and XC via the bit switches, and lines XT and XC are cross coupled by the PFET devices 32 and 33. Line XT starts to be discharged to zero through the cell 10 but at the same time it is hold and slowed down by the PFET device 32 as long as line XC is on a low level. In turn device 32 is switched on and thereby raises line XT to the full VDD level. Now line XC can switch off PFET device 33 and a 'zero' can be developed on line XT and applied to the data out driver 14. The above operations are represented by the pulse diagram of FIG. 2 wherein the pulse curves are designated according to the signals or lines indicated in FIG. 1. The voltage levels –0.1 to 1.8 of the pulse curves are represented over a defined time scale.

Figure 3:
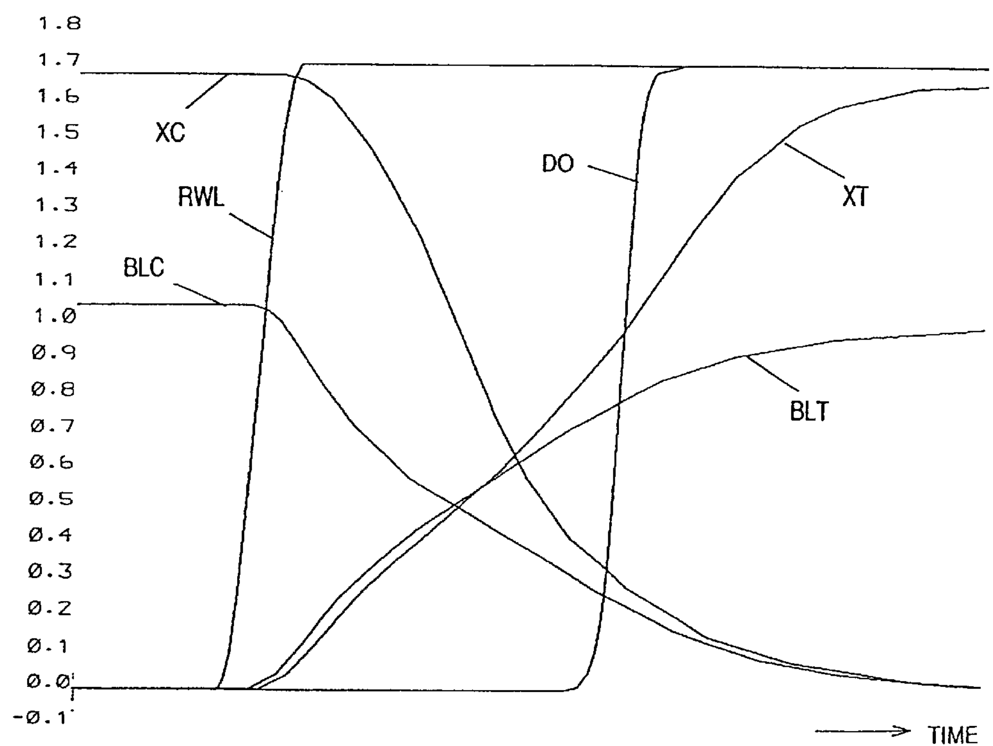

If a "1 is read out of the storage cell 10, bit line signal BLT is driven to a weak one. Line XT will develop a full VDD level only after bitline signal BLC went low and has activated the PFET device 33. The discharge of line XC is slowed down by device 33 as long as the bitline signal BLT is on low level (FIG. 3).

Figure 4:
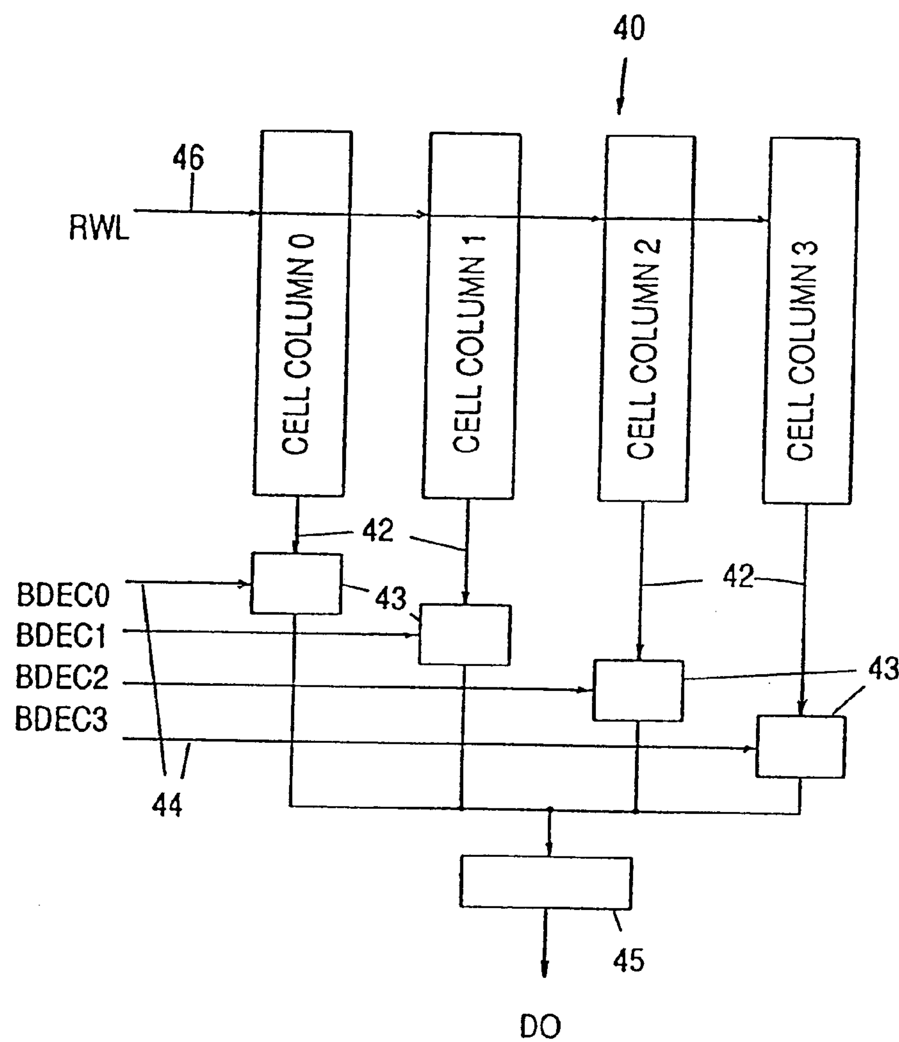
FIG. 4 a block diagram of a semiconductor storage array wherein the circuit according to the invention is used.

In FIG. 4 a block diagram of a semiconductor storage array column 40 is shown wherein the circuit according to the invention is used. The storage array 40 comprises four storage cell columns O, 1, 2, 3 each of which is connected through a dual bitline 42 to one of four read heads 43 each having integrated a bit select circuit. Signals BDEC0, BDEC1, BDEC2, BDEC3 on lines 44 serve to select one of that bit select circuits. The signals BDEC0, BDEC1, BDEC2, BDEC3 are generated by a bit decode circuit not shown. The output lines of the read heads 43 are connected to a data out driver 45. Reading of bit storage cells in the columns O, 1, 2, 3 takes place in parallel by a signal RWL on a read wordline 46. The read signals of one of the cell columns O, 1, 2, 3 are selected and shaped in the selected one of the circuits 43 and fed to the data out driver 45.

Figure 5:
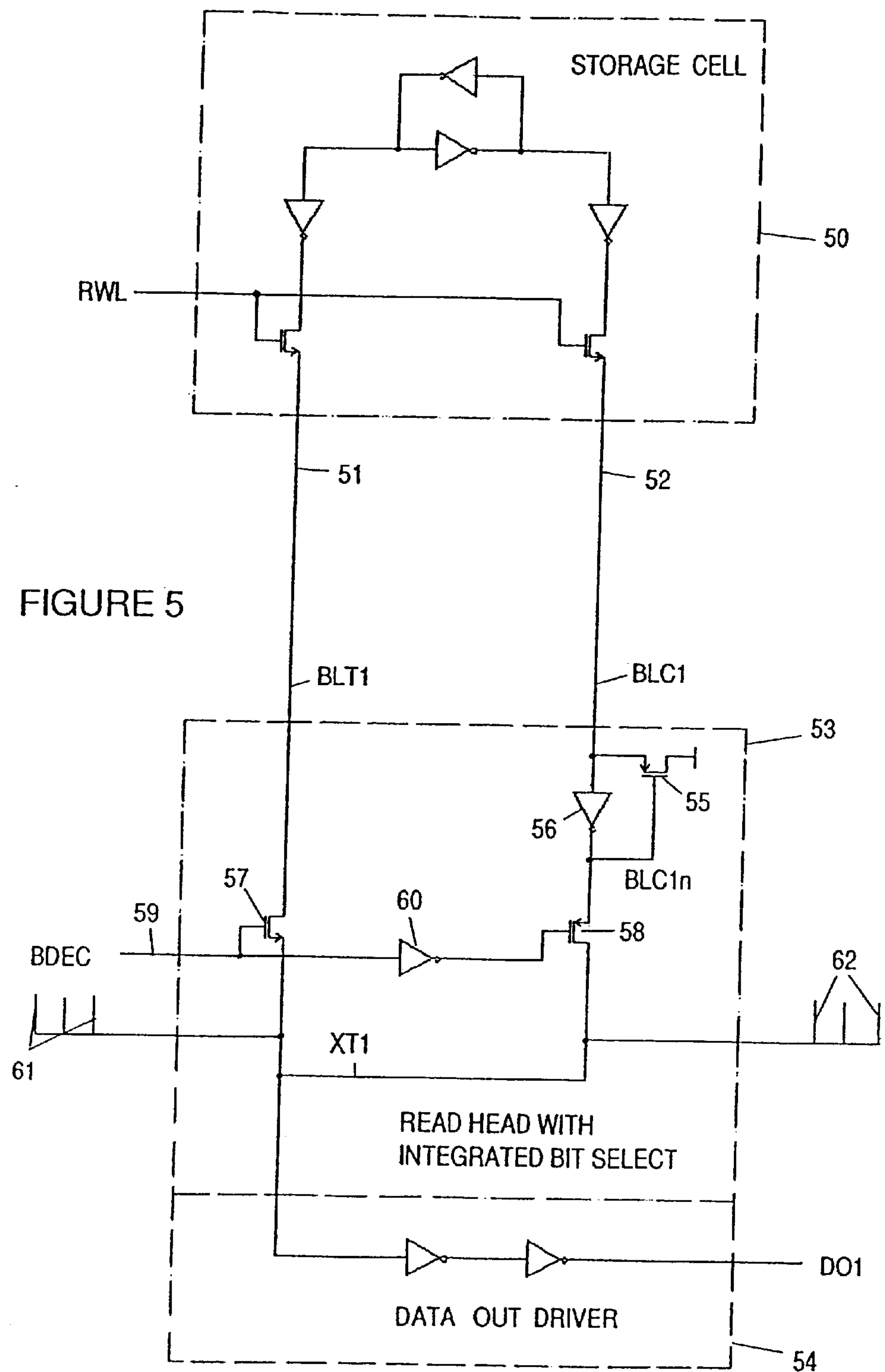
FIG. 5 a circuit diagram of a dual bitline read circuit according to the invention.

FIG. 5 shows a cross-section of the storage array of FIG. 4 comprising a read head 53 according to the invention which corresponds to one of the read heads 43 of FIG. 4.

Furthermore, FIG. 5 shows a single storage cell 50 and a data out driver 54. The components of which correspond to the components 10 and 14 shown in FIG. 1.

The read head 53 according to the invention avoids the cross-coupled PFET devices 32 and 33 of FIG. 1 which slow down the signal development on the bitlines in either direction. The read head 53 provides instead a circuit wherein both logical signal levels (zero and one) are directly applied to the data out driver 54. The read head 53 also avoids a separation of the bit select function from the read head function as it is provided in circuit of FIG. 1 but instead integrates the bit select function fully into the read head 53. Furthermore, the read head 53 avoids a bitline swing control circuit and its standby current such as described with reference to FIG. 1. No IDD control signal and its related control circuitry, including line 27, is thus necessary in the circuit of FIG. 5.

The storage cell 50 is connected to the read head 53 by bitlines 51 and 52 which carry bitline signals BLT1 and BLC1. Signal BLT1 represents the true bit stored in cell 50 and signal BLC1 represents the complement of the bit stored in cell 50. Read head 53 comprises an inverter 56 in the bitline 52 which generates as output signal BLC1n a 'strong one' in response to a 'zero' bitline signal BLC1. The inverter 56 and a PFET device 55 form a feedback loop which supports the generation a 'zero' output of the inverter 56 by pulling up a 'one' bitline signal BLC1 to the full VDD level. The output signal of the inverter 56 is directly applied to the output line XT1 of the read head 53 and thus to the data out driver 54. The output signal of the read head 53 can thus be properly sized to drive the data out driver 54.

The bit select function is fully integrated into the read head 53 and uses a NFET pass device 57 in the bitline 51 for generating a strong 'zero' bitline signal BLT1 and further uses a PFET pass device 58 which is connected to the output of the inverter 56 for passing its strong 'one' output signal through line XT1 directly to the data out driver 54. The NFET pass device 57 is controlled by a BDEC signal on a bit select line 59. This line is also connected to an inverter 60 the output of which controls PFET pass device 58. As indicated by lines 61 and 62 the data out driver 54 is common to a plurality of read heads 43 as shown in FIG. 4.

Figure 8:
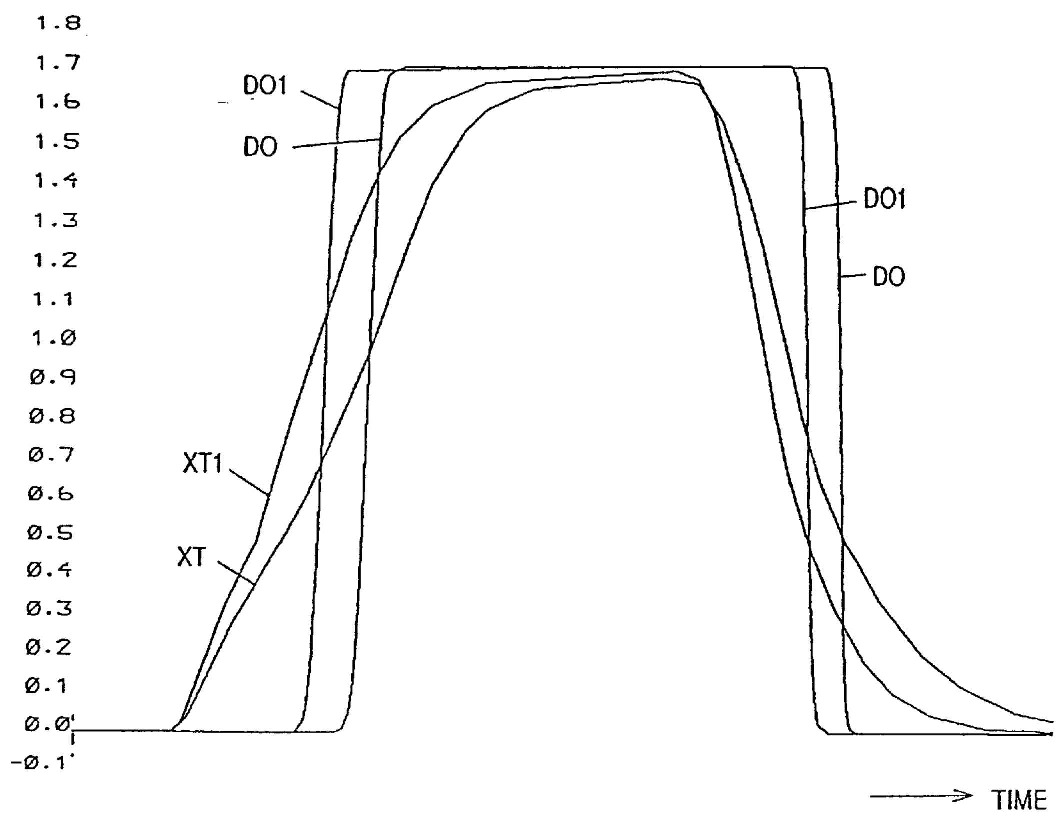
FIG. 8 a comparative pulse diagram related to the operation of the circuits shown in the FIGS. 1 and 5.

If a "0" is read out of the storage cell 50, bitline 51 and NFET pass device 57 is driven to zero by the cell 50. The weak 'one' signal BLC1 on bitline 52 is inverted by inverter 56 and applied to line XT1 by the PFET pass device 58. In this phase of the read cycle a 'zero' is generated by generating a strong 'zero' on bitline 52 and a weak 'zero' on line XT1 which support each other in driving the input of the data out driver 54 (FIG. 8). As long as bitline 52 has a low level signal which is inverted to a 'one' signal by inverter 56, the signal development on line XT1 is slowed down but the PFET pass device 58 weakens this effect.

The half latch device consisting of PFET device 55 and inverter 56 pulls up bitline 52 to VDD level to eliminate any DC current in the inverter 56. Because the PFET device 55 is not performance critical with regard to the inverter 56, it can be made very small to minimize any performance impact. By tuning the p/n device sizes ratio of the inverter 56 the read access of a 'zero' and a 'one' can be easily balanced.

Figure 7:
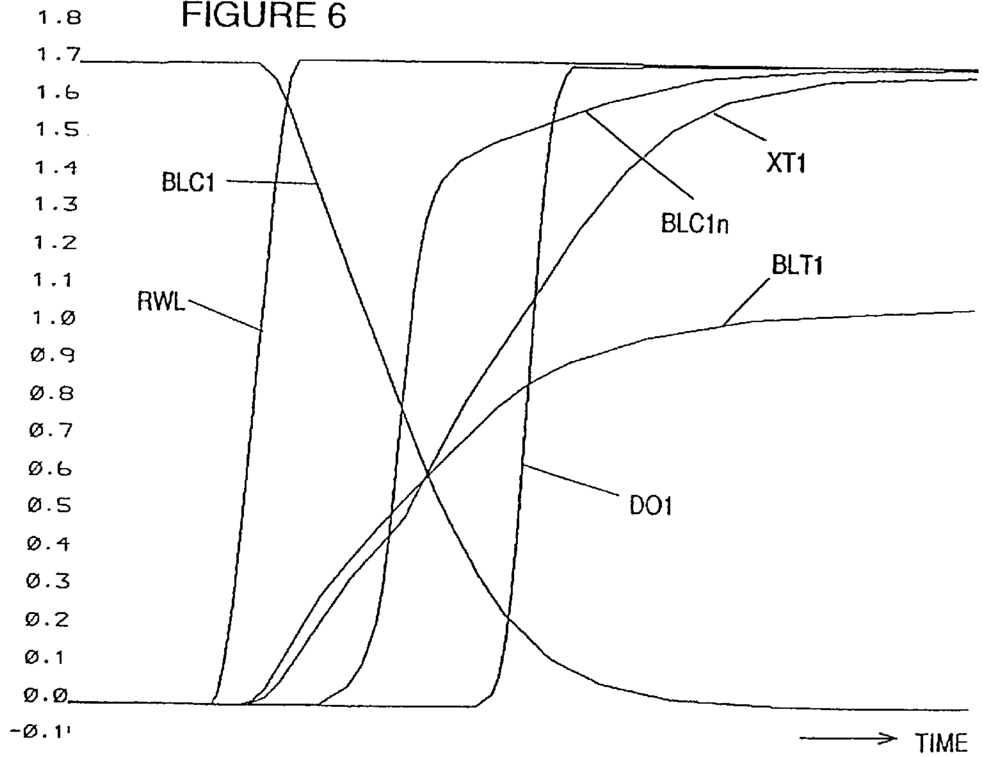

If a "1 is read out of the storage cell 50, bitline 51 is driven to a 'weak one' and bitline 52 is driven to 'zero' which signal is inverted to 'one' by inverter 56. This time the PFET pass device 58 is the strong device and passes the 'one' to the data out driver 54 while the NFET pass device 57 supports the generation of this signal by passing the 'weak one' on bitline 51 (FIG. 7). Biasing the p/n ratio of the inverter 56 speeds up this signal development. The 'one' generated by inverter 56 and passing device 58 directly drives the data out driver 54. This direct operation allows to increase the device size and achieve higher drive capability.

Figure 6:
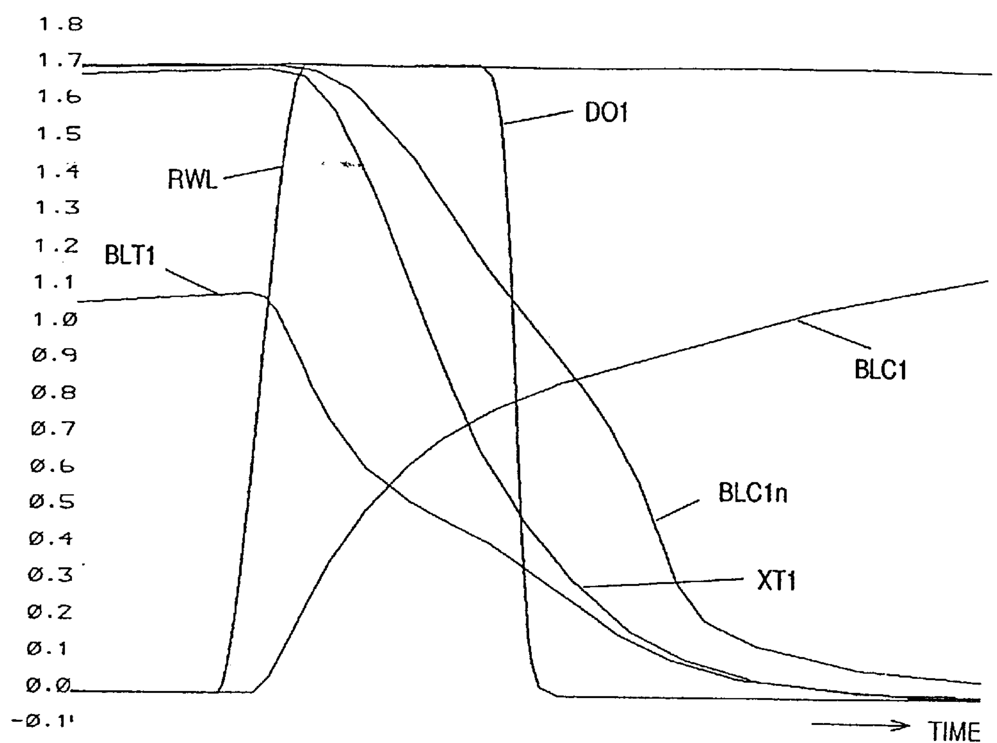
FIGS. 6 and 7 pulse diagrams related to the operation of the circuit shown in FIG. 5.

The pulse diagrams of FIGS. 6 and 7 show the operation of the components of read head 53 according to FIG. 5. FIG. 6 relates to a read 'zero' and FIG. 7 relates to a read 'one'. Each of the pulse curves shown is designated according to the designation of the related component in FIG. 5. In FIG. 8 the pulse curve DO of the prior art circuit according to FIG. 1 and the pulse curve DO1 according to the circuit of FIG. 5 are compared indicating the time difference by which DO1 is faster than the prior art circuit. By means of the invention a performance improvement of read operations and write through operations of static storage arrays up to 25% can be achieved.

What is claimed is:

1. A read circuit for semiconductor storage cells, comprising:

a) at least two read out switches;

b) dual read bitlines;

c) a wordline, said wordline controlling read out switches;

d) a bit select circuit for selecting one of a plurality of bitline pairs of storage cells activated by the same wordline for a read operation;

e) a read head circuit for sensing the voltage difference between the bitlines, said read head circuit converting dual read bitline signals to single bitline signals, said single bitline signals capable of being applied to a data. out driver, said read head circuit having an input, said read head circuit comprising an inverter in the first one of the bitlines, said inverter turning a weak one signal to a full zero signal and wherein said bit select circuit is integrated into the read head circuit by connecting the second one of the bitlines through a first bit select switch directly to the output of the read head circuit arid by connecting the output of said inverter through a second bit select switch directly to the output of the read head circuit.

2. A read circuit according to claim 1, wherein the first bit select switch is a NFET device and the second bit select switch is a PFET device.

3. A read circuit according to claim 2, further comprising a bit select line connected to the first bit select switch and through an inverter to the second bit select switch.

4. A read circuit according to claim 1, wherein the bitline connected to said inverter is assigned to the complement output of the storage cell.

5. A read circuit according to claim 1, further comprising a feedback loop from the out put of said inverter to its input including a PFET switch, said loop controlled by the output of the inverter, wherein said feedback loop supports the generation of a zero output by the inverter by pulling up a one bitline signal to the full VDD level.

6. A read circuit for semiconductor storage cells, comprising:

a) at least two read out switches;

b) dual read bitlines;

c) a wordline, said wordline controlling read out switches;

d) a read head circuit for sensing the voltage difference between the bitline, said read head circuit combining dual read bitline signals to single bitline signals, said single bitline signals capable of being applied to a data out driver, said read head circuit having an input, said read head circuit comprising an inverter in the first one of the bitlines, said inverter turning a weak one signal to a full zero signal and said inverter directly coupling the output of said inverter to the second one of the bitlines which is connected to the read out driver.

7. A read circuit according to claim 6, wherein the bit line connected to said inverter is assigned to the complement output of the storage cell.

8. A read circuit according to claim 6, further comprising a feedback loop from the out put of said inverter to its input including a PFET switch, said loop controlled by the output of the inverter, wherein said feedback loop supports the generation of a zero output by the inverter by pulling up a one bitline signal to the full VDD level.

9. A method of converting read signals of a semiconductor storage cell, the method comprising:

inverting a read signal on a first of dual read bitlines, said dual read bitlines selected by a wordline through read out switches in the bitlines, the read signal converting a weak one signal into a full zero signal;

combining the inverted read signal with the read signal of the second one of the dual read bitlines; and applying the combined read signal to a read out driver.

10. The method according to claim 9, further comprising the step of using a bit select signal to control the switching between the inverted read signal and the read signal on the second bitline.

11. The method according to claim 9, wherein the first bitline connected to the inverter is assigned to the complement output of the storage cell.

12. A method according to claim 9, further comprising the step of feeding the inverted read signal back to said first bitline through a PFET switch, the feeding facilitating the generation of a zero bitline signal from a one bitline signal on the first bitline.

* * * * *